United States Patent [19]

Kahn

[11] Patent Number: 4,479,153
[45] Date of Patent: Oct. 23, 1984

[54] SQUELCH AND MESSAGE STORAGE SYSTEM AND METHOD

[76] Inventor: Leonard R. Kahn, 137 E. 36th St., New York, N.Y. 10016

[21] Appl. No.: 30,026

[22] Filed: May 9, 1979

Related U.S. Application Data

[63] Continuation-in-part of Ser. No. 708,203, Jul. 23, 1976, abandoned.

[51] Int. Cl.³ ............................................. H04B 1/10
[52] U.S. Cl. ..................................... 360/53; 455/218; 455/221; 455/242; 455/63
[58] Field of Search ........................ 360/7, 39, 53, 54; 340/148, 825.72, 825.15; 455/221, 222, 218, 63, 35, 242, 223, 225

[56] References Cited

U.S. PATENT DOCUMENTS

| | | | |
|---|---|---|---|
| 3,024,458 | 3/1962 | Cohen et al. | 360/7 |
| 3,341,833 | 9/1967 | Jones | 360/7 |
| 3,885,090 | 5/1975 | Rosenbaum | 360/7 |
| 4,143,325 | 3/1979 | Kahn | 455/221 |
| 4,153,878 | 5/1979 | Osborn | 455/221 |

*Primary Examiner*—Marshall M. Curtis

[57] ABSTRACT

A system and method for squelching noise and storing messages. Many receiving systems produce noise bursts at the end of the reception of a message and prior to the operation of the muting circuit. Such noise bursts are especially severe in frequency modulation systems using limiters. By delaying the audio signal until the squelch circuit's hang time is completed the noise bursts are muted.

One application of this invention is in vehicles such as police cars and taxicabs. For such an application one of the essential parts of almost every message is the street address where the vehicle is needed. Since it is easy to confuse addresses, and thereby require a repeat of the message, a recording of at least the address portion of the message would be most useful. A storage system is provided in order to allow the repetition of messages.

2 Claims, 3 Drawing Figures

SQUELCH AND MESSAGE STORAGE SYSTEM AND METHOD

RELATED APPLICATION

This application is a continuation-in-part of my now abandoned application, Ser. No. 708,203, filed July 23, 1976 entitled Improved Squelch and Message Storage System and Method.

BACKGROUND OF THE INVENTION

There are a number of methods for squelching or muting radio receivers so as to avoid the disturbance and fatigue caused by the reception of noise during idle radio circuit periods. For example, and improved squelch system was described in my U.S. Pat No. Re. 27,202 and further improvement were disclosed in patent application Ser. No. 693,716 filed on June 7, 1976.

Squelch circuits commonly utilize a "hang time" of 0.1 to 5.0 seconds so that if there is a short interruption in the signal flow the communications circuit continues to operate. The term "hang time" as used in this specification and certain of the appended claims is defined as the time a squelch circuit requires to revert to the squelched state at the end of a transmission. It is important to incorporate circuitry in squelch systems which provides hang time so as to avoid annoying interruptions of speech reception during short fades or other breaks in reception. Such interruption can cause loss of speech information and introduce clicks. Even longer hang times may be used in suppressed carrier SSB transmission systems where pauses in speech produce corresponding pauses in transmission. In mobile communications system, no matter what type of modulation is used, the signal strength can suddenly decrease and cause the squelch circuit to mute the audio system. In such cases, a long squelch hang time can avoid lengthening interruptions in reception.

One disadvantage in using long hang times is that a noise "burst" or noise "tail" may be heard. This is particularly disturbing if FM systems incorporating limiters are used because the limiters fill the system with noise when the signals are absent. It is also disturbing for other types of communications systems where the hang time is long enough for the AVC circuit to recover, increasing the receiver's gain before the system is squelched. Also, some transmitters emit high noise levels as they are keyed off, which is disturbing to the listener.

One procedure for easing this noise burst problem is to shorten the hang time to a point where the noise burst is of such short duration that it is not disturbing. However, if the hang time is so reduced to say less than one-tenth of a second, this system will be sensitive to signal dropout problems mentioned above.

The Di Toro U.S. Pat No. 3,081,457, Adams et al U.S. Pat. No. 3,195,048, Rosenberg et al U.S. Pat. No. 3,305,782 and Hepp U.S. Pat. No. 3,739,285 U.S. patents all disclose means for utilizing storage means for improving the signal-to-noise ratio of radio systems. Of particular interest here is Winterbottom's U.S. Pat. No. 3,397,401 which describes various methods of using delay means for the removal of noise bursts at the end of signal transmission.

SUMMARY OF INVENTION

The general object of the instant invention is to provide a means for improving squelch performance by removing or greatly attenuating noise bursts at the end of signal transmissions. A further object is to provide a system which can utilize a long hang time so as to avoid squelch operation during short signal drop outs.

A futher object of the present invention is to provide means for repeating signal messages so as to avoid the need for "say again" transmissions.

The basic method in this invention utilizes a memory system for both delaying and storing received signals wherein the delay provided is sufficient to provide time for detecting the end of a transmission and operating a muting circuit and also to provide storage for at least a significant portion of the last received message. The invention utilizes means for determining the end of a transmission and means for eliminating, or at least substantially attenuating, the output of the system based on the determination that the signal transmission has ceased but before the tail end noise bursts reaches the audio output of the system.

In addition, means are provided for allowing one to conveniently repeat a desired stored message. Said means include mechanical storage means comprising endless loops or magnetic drums and non-mechanical means such as charge coupled electronic systems. In the following specification and claims, the term endless loop is defined so as to include the term magnetic drum.

Another embodiment of this invention would utilize a conventional non-endless tape loop arrangement such as reel to reel or cassette systems and would have sufficient storage to record all message received during, say, an eight hour period. This might be useful for police operation in that at the end of a duty period a police officer would have a record of received messages.

Such an arrangement may be used to repeat messages by pushing a button which would accomplish the following:

(a) Backup (rewind) the tape, and
(b) Play the tape back for a fixed amount of time.

For example, a most convenient arrangement would be for the user to push a momentary contact push button switch and cause the tape to back up a fixed amount; say a 15 second record interval and then it would play back to the same 15 second period. If the user pushed the momentary contact switch twice it could rewind to a point where he would hear a repeat of the last 30 seconds, and if he pushed it three times the last 45 seconds, etc. Since for most situations the 15 second segment would suffice, such a system simplifies operation and avoids making the operator wait too long for the message that he wishes to hear repeated.

The stopping of the tape at the end of the recorded message could be accomplished by a mechanical timing device such as a clock mechanism that would stop the tape in increments of 15 seconds, for example.

An alternative arrangement would be for the tape to be prerecorded with a tone, for example, at 20 kHz, which would be erased whenever messages are recorded. Thus, the tape mechanism would operate until it sensed the 20 kHz tone, and at that time the record playback mechanism would cause the tape to stop, readying it for use for the next message. Such methods for filtering and detecting the presence of a tone and using the detected tones for controlling the operation of a tape mechanism are well known to those skilled in the appropriate art. For example, the Ampex Corporation of Redwood City, Calif., manufactured a model 1100 tape recorder which reversed the direction of a tape when a recorded tone was sensed.

BRIEF DESCRIPTION OF THE DRAWINGS

The foregoing and other objective features and characteristics of the present invention will be apparent from the following specification, description, and accompanying drawings relating to typical embodiments thereof wherein like numerals refer to like parts and wherein.

DESCRIPTION OF PREFERRED EMBODIMENTS

Figure 1:
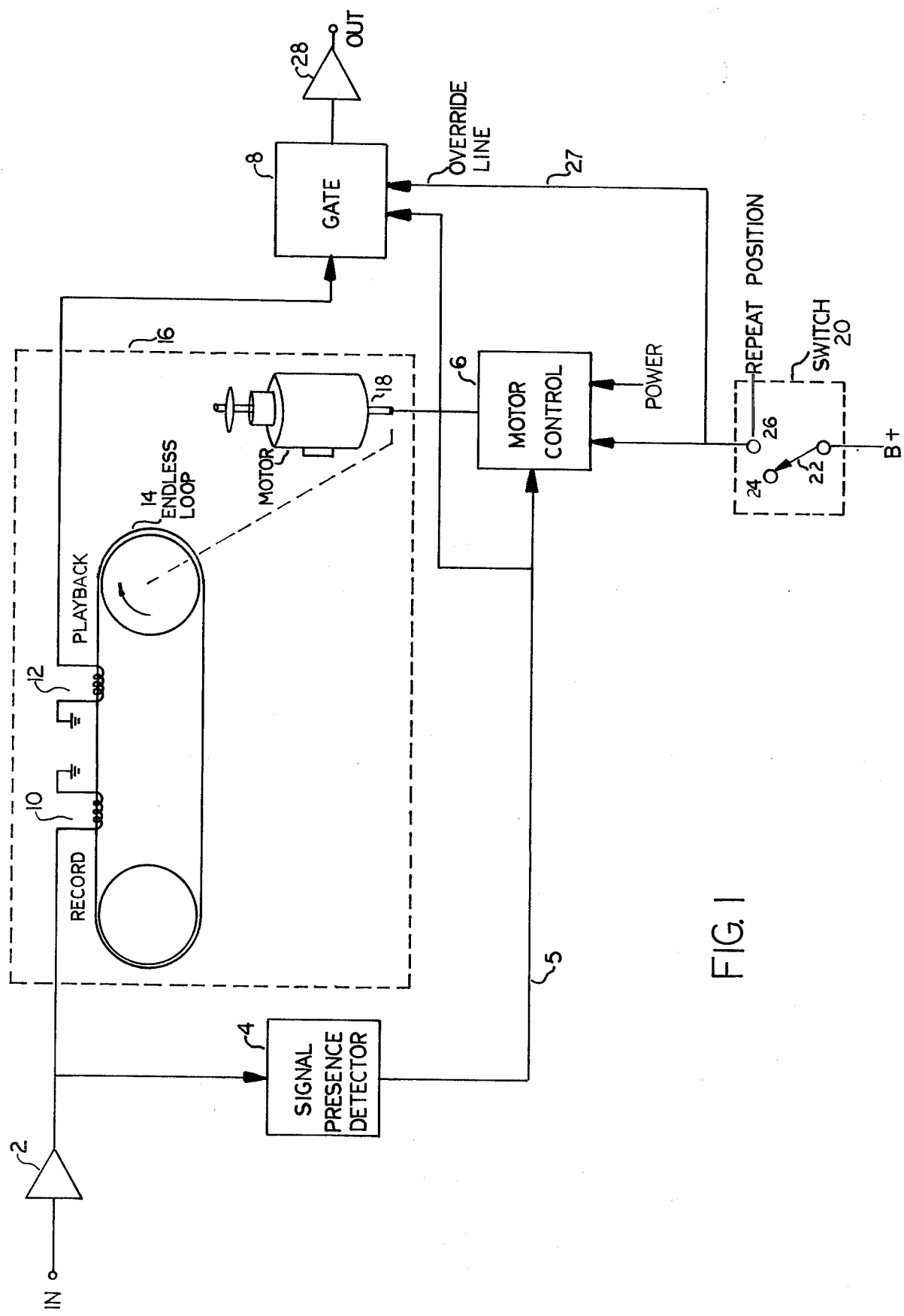
FIG. 1 shows, in block and schematic form, the system as applied to squelch and signal strength circuits.

FIG. 1 is a combination schematic and block diagram of one embodiment of the invention. The audio input to the device is generated by the associated receiver and is fed to amplifier 2. This amplifier is required if the level of the incoming wave is insufficient to operate the circuitry immediately following the output of the amplifier. The output of amplifier 2 feeds signal presence detector 4. This device is used to determine whether signal is present or absent. One circuit suitable for determining the presence of signal is described in U.S. Pat. No. Re. 27,202.

The output of the signal presence detector 4, controls the motor circuit 6. When signal is present, motor control circuit 6 feeds power to motor 18. Motor 18 is part of the delay and/or storage circuit 16. The motor 18 causes the tape to move past record head 10. A suitable magnetic delay circuit would comprise an endless loop 14, a record head 10, and a play back head 12, spaced at the distance required to provide a time delay of say 1 second. If the circuit is to be used for message storage as well as signal delay, the length of the tape loop should be long enough to store the desired messages. Not shown is the erase head and the bias circuit which are well known circuits to those skilled in the art of designing magnetic recorders.

Figure 2:
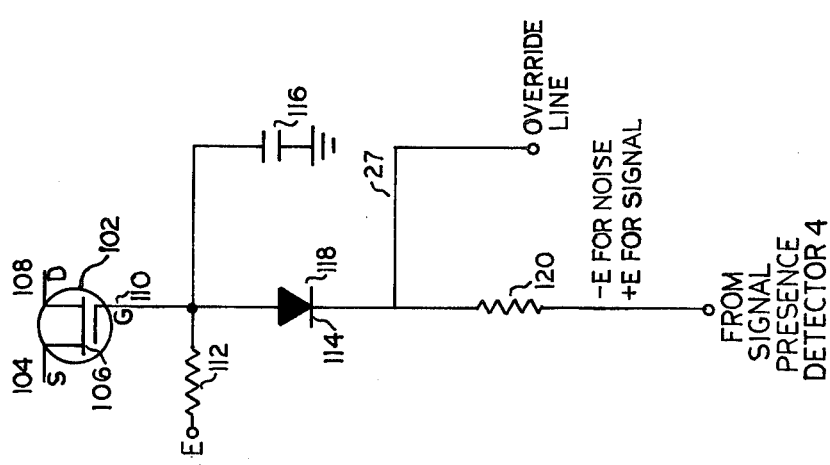
FIG. 2 shows, in schematic form, details of one type of gate circuit which may be used for block 8 of FIG. 1.

Also, controlled by the signal presence detector 4, is a gate circuit 8. The gate opens, blocking noise whenever signal is absent. In one embodiment of the invention, the gate should close slowly so that it only closes in time to pass the new message and not respond to the last message or the noise burst at the end of the last transmission which has been recorded on the tape. This delay action can be readily produced by use of an RC delay circuit as shown in FIG. 2 and discussed below.

Another procedure that would avoid the problem of hearing the last message or noise on the tape, rather than the beginning of the new message, would be to allow the magnetic storage device to continue to rotate for a short period after gate 8 is opened and motor 18 is deenergized due to normal inertia and friction effects in the recording mechanism until the tail end noise burst passes the playback head 12. Such an effect may also be achieved by constructing a brake so as to have a slow action. In this case, the gate can close as soon as signal presence is detected. The advantage of using normal friction to stop the loop is that it reduces the cost of the system be eliminating or simplifying the brake mechanism and also reduces wear of the mechanism and stress on the tape.

The spacing between record head 10 and playback head 12 should be sufficient to insure the delay of the message so that the signal presence detector 4 has sufficient time to operate to the mute condition which disables the gate, thus eliminating the noise bursts at the end of the message.

The output of gate 8 feeds an output amplifier 28 which may feed associated loudspeaker or earphones.

An additional advantage of this system is that the user may repeat a message if desired. This can be accomplished in one embodiment of the invention as also shown in FIG. 1.

Switch 20 can be set to the repeat position; i.e., connecting B+ to contact 26 providing power to motor control 6 which energizes the record mechanism. The output of playback 12 is then fed to gate 8 which is forced to the closed position so that the listener can hear the message recorded on the endless loop. The length of the loop and the speed of the mechanism determines how long a message may be repeated. For many applications, a loop repeat time of 15 seconds to one minute is sufficient to recover the desired repeated information.

Switching circuitry can also be provided that can switch the erase and record circuitry off so that the next message does not erase the stored information before the user has repeated the message.

Non-mechanical memory systems may be used instead of the mechanical systems where maintenance and reliability are important system specifications. However, some non-mechanical memory systems, such as the change coupled device memories, must be periodically refreshed. For example, the Fairchild Camera and Instrument Corp. of Mountain View, Calif., manufactures a semiconductor unit, CCD-461, which requires that the device be refreshed every 10 milliseconds when the device is at a temperature of 55° C. However, in an article entitled "Charge-Coupled Devices for Memory Applications", appearing in the Conference Proceedings, Volume 44, 1975, of AFIPS as published by AFIPS Press, Montvale, N.J., Mr. G. F. Amelio of Fairchild Research and Development pointed out that CCD storage elements used at artificially reduced temperatures of −30° C., have required refreshing periods of approximately 20 seconds. For applications of this invention which store messages of less than 20 seconds duration such an arrangement is suitable. However, even though the refresh period is long enough, the refreshment requirement still poses a problem because after the message is received, the memory must be set to recirculate and if the user wishes to listen to the beginning of the message he has to wait until the storage cycle reaches the starting point.

To alleviate such a problem, the clock should be switched to high speed operation so that the complete memory cycle is accomplished in say 10 milliseconds. This high speed clock operation would be activated at the end of the message, then later when one wished to audit the message it would only be necessary to wait for a maximum period of 10 milliseconds to locate the beginning of the stored message and then the clock would be returned to its normal read out speed.

In order to properly locate the start of the stored message it is necessary to provide means for identifying the start of the stored information by, for example, inserting a special series of zeroes and ones into the bit stream. This special identification wave can then be searched for a high speed when one wishes to read out the stored message. The clock can then reduce speed to the normal read out speed and start to read out the stored information.

In other embodiments of this invention, keyed tones may be transmitted to activate the message storage circuit. Activation of the storage only during important periods is advantageous as it saves the time of the person playing back the message and minimizes the length of storage required and this is especially important where a solid stage memory of limited capacity is used. The dispatcher may activate a switch whenever he or she gives an address that may be confused and the tone can be used to cause the record system to be activated. The frequency of the tone or tones can be used to selectively operate equipment only in a specific vehicle.

Figure 3:
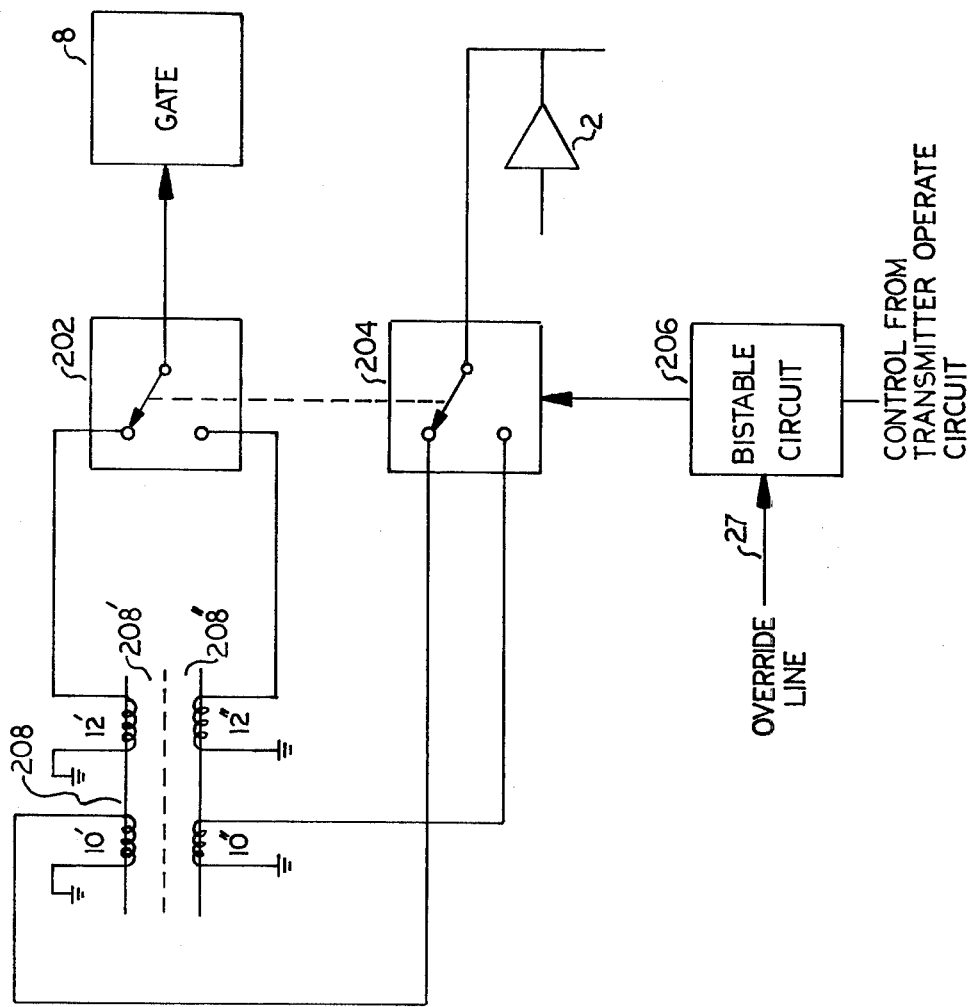
FIG. 3 shows, in block and schematic form, a system for improving message storage.

Also, as stated above, circuitry may be provided so that the person receiving the message can activate a memory hold circuit by operating a push button switch, or a circuit can be activated automatically when he transmits an acknowledgment signal. After a specified period, the message storage may be released so as to accept the next message. It is also useful for certain systems to provide two memory segments; one which stores a message after a first acknowledgement transmission, and a second that stores each new message. On the next acknowledgment, the original message is erased and the new message is stored. One means for achieving this form of operation is a dual track endless loop recording system which is shown in FIG. 3 and described below.

It is also feasible to use voice recognition devices to turn on the record mechanism when the words, for example, "go to", are detected.

FIG. 2 shows one arrangement for providing a gate circuit with a slow-close-fast-open characteristic suitable, in some embodiments of this invention, for use as Block 8 of FIG. 1. This type of circuit will block noise bursts stored in the delay circuit and keep them from reaching the output of the system. An insulated gate enhancement type field effect transistor 102 is used to pass or block the signal. The FET requires a positive gate voltage to say +E/2 to conduct and its channel 106 presents a high resistance between its source 104 and its drain 108 if appreciably less than +E/2 is fed to its gate 110.

When signal is absent, the signal presence detector 4, of FIG. 1 would, for example, produce a negative voltage (−E) which passes through a relatively small resistor 120, say 1,000 ohms, to diode 118. Since the diode's cathode 114 is negative under such a situation it conducts and quickly charges capacitor 116 which, for example, may have a valve of 1 ufd. Thus, when the signal is absent, the FET is quickly made to present a high resistance between its source and drain thereby muting the signal.

If signal is detected, a +E voltage is produced by the signal presence detector and diode 118 is back biased terminating current flow through the diode. Capacitor 116 is then charged through resistor 112. When capacitor 116 charges to +E/2 FET 102 switches to a low resistance. Resistor 112 has a large resistance value whereas resistor 120 has a relatively low value and therefore the time for the circuit to start to pass signals is much larger than to mute signals. Typically, the resistor will be from 1 to 5 megohms. As shown in FIG. 1 an override line 27 is connected to contact 26 of switch 20. When a repeat message is required, the positive voltage from switch 20 overrides the negative voltage from the signal presence detector and causes the FET to pass the recorded signal.

FIG. 3 shows one arrangement for storing specific information while allowing the storage to be used to remove noise bursts and allow the recording of new messages that may replace the presently stored information. The output from amplifier 2, shown in FIG. 1, and described above, feeds electronic switch 204. This switch is controlled by bi-stable circuit 206. This bi-stable circuit which may be a multivibrator circuit is controlled by the local transmitter control circuit. Whenever the local transmitter initiates a transmission, or if more convenient terminates a transmission, the bi-stable circuit switches from one stable condition to the alternative stable condition. In one condition of bi-stable circuit 206 both electronic switches 202 and 204 switch to the position shown in FIG. 3 and in the other bi-stable condition the switches are in their alternative position.

By this procedure, record heads 10' and 10" are alternatively switched into operation recording on the 208' half of the tape or alternatively the other half of tape 208; i.e., 208". At the same time, electronic switch 202 causes the corresponding selection of playback head 12' or alternatively 12". This arrangement allows the final transmitter operation to maintain storage of the last message directed to the vehicle while the alternative tape section is free to record and delay all new messages. The method described is for a mechanical tape storage such as endless loop systems, but as would be understood by those skilled in the art, non-mechanical storages may be used alternatively.

When the user desires to hear the stored message it is necessary for him to operate a control which will switch in the memory not presently in operation but which has stored the information. This can be accomplished by feeding an override voltage from line 27 to bi-stable circuit 206 so that it flips to the other stable operating condition and, accordingly, switches 202 and 204 to the alternate position. The override line voltage also, as previously mentioned, forces the gate 8 closed and sets other parts of the system to the playback condition.

When repeating a message it may be desirable to hear the receiver output in case an important message comes through during the time the user is listening to the repeated message. In such a case, circuitry should be provided to feed the output of the receiver directly to the utilization device so that the user can hear both the repeated message and any incoming messages. In some situations it may be desirable to reduce the level of the receiver output before combining it with the repeated message so that the noise from the receiver does not disturb intelligibility. An attenuator, in the range of 10 to 20 db, will generally provide proper operation. In another version of the system, the signal presence detector can be used with an auxiliary gate so that the receiver output would only be heard if, in fact, a signal is present and the noise from the receiver would be muted so that if signal is not present the listener to the repeated message would not be disturbed.

The embodiments described herein show storage and signal processing at audio frequencies, but, of course, if such functions can be accomplished more conveniently at radio or intermediate frequency the invention may be so practiced.

In all cases, it is understood that the above described arrangements are merely illustrative of the many possible specific embodiments which represent applications of the present invention. Numerous and other varied arrangements can be readily devised in accordance with the principles of the present invention without departing from the spirit and scope of the invention.

What is claimed is:
1. A squelch system comprising;
   (a) means for determining if a signal is present, including hang time means,
   (b) means for delaying a signal using an electromechanical recording system said means delaying the signal for a period of time approximately equal to the hang time of the signal presence determining means,
   (c) means for rapidly muting sounds when the signal presence determining means hang time period is completed indicating that signal is no longer present, and,
   (d) means controlled by signal presence determining means for stopping the motion of the recording medium in a period equal to or greater than the approximate hang time of the squelch circuit so as to ensure that at least most of the noise tails that may be present at the input to the squelch system are not present at the output of the squelch system during subsequent transmissions.

2. The squelch system of claim 1 wherein said signal delaying means includes means for repeating messages including rewind means.

* * * * *